(12) United States Patent
Li et al.

(10) Patent No.: US 11,205,763 B2
(45) Date of Patent: Dec. 21, 2021

(54) ORGANIC ELECTROLUMINESCENT DEVICE AND AN ORGANIC ELECTROLUMINESCENT APPARATUS

(71) Applicant: Yungu (Gu'an) Technology Co., Ltd., Langfang (CN)

(72) Inventors: Weiwei Li, Langfang (CN); Lin He, Langfang (CN); Mengzhen Li, Langfang (CN); Jingwen Tian, Langfang (CN); Tiantian Li, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 20 days.

(21) Appl. No.: 16/706,873

(22) Filed: Dec. 9, 2019

(65) Prior Publication Data

US 2020/0111985 A1    Apr. 9, 2020

Related U.S. Application Data (63) Continuation of application No. PCT/CN2018/106346, filed on Sep. 19, 2018.

(30) Foreign Application Priority Data

Jun. 29, 2018  (CN) .......................... 201810713383.5

(51) Int. Cl.
*H01L 51/50* (2006.01)
*H01L 51/00* (2006.01)

(52) U.S. Cl.
CPC ...... *H01L 51/5076* (2013.01); *H01L 51/0005* (2013.01); *H01L 51/504* (2013.01); *H01L 51/5088* (2013.01); *H01L 51/5096* (2013.01)

(58) Field of Classification Search
None
See application file for complete search history.

(56) References Cited

U.S. PATENT DOCUMENTS

| | | | |
|---|---|---|---|
| 6,566,807 B1 * | 5/2003 | Fujita | H01L 51/506 313/506 |
| 2012/0001156 A1 * | 1/2012 | Cho | H01L 27/3279 257/40 |

(Continued)

FOREIGN PATENT DOCUMENTS

| CN | 103715360 A | 4/2014 |
|---|---|---|
| CN | 103811533 A | 5/2014 |

(Continued)

OTHER PUBLICATIONS

Written Opinion of the International Searching Authority dated Mar. 28, 2019, 8 pages.

(Continued)

*Primary Examiner* — Erik Kielin
(74) *Attorney, Agent, or Firm* — Kilpatrick Townsend & Stockton, LLP (57) ABSTRACT

An organic electroluminescent device and an organic electroluminescent apparatus are disclosed. The organic electroluminescent device includes a first electrode layer, a first carrier functional layer, a light-emitting layer and a second electrode layer stacked in sequence, wherein a P-doped layer is arranged between the first carrier functional layer and the light-emitting layer. Thus the energy level bending of an interface between the first carrier functional layer and the light-emitting layer is modified, and the hole injection potential barrier at the interface between the two is reduced, thereby effectively reducing the turn-on voltage of the organic electroluminescent device.

15 Claims, 3 Drawing Sheets

(56) References Cited

U.S. PATENT DOCUMENTS

| | | | |
|---|---|---|---|
| 2014/0070185 | A1 | 3/2014 | Im et al. |
| 2016/0035993 | A1 | 2/2016 | Huangfu et al. |
| 2016/0099417 | A1 | 4/2016 | Sato et al. |
| 2016/0141543 | A1 | 5/2016 | Gao et al. |
| 2016/0284766 | A1 | 9/2016 | Wang |
| 2016/0322568 | A1* | 11/2016 | Fadhel ............... C07F 9/64 |
| 2017/0098793 | A1 | 4/2017 | Isomura et al. |
| 2017/0256595 | A1 | 9/2017 | Wang et al. |
| 2018/0026219 | A1 | 1/2018 | Li et al. |
| 2018/0033996 | A1 | 2/2018 | Wang et al. |
| 2018/0047925 | A1* | 2/2018 | Kim ............... H01L 51/5096 |
| 2018/0076391 | A1 | 3/2018 | Huang et al. |
| 2018/0138439 | A1 | 5/2018 | Voges et al. |
| 2019/0051849 | A1* | 2/2019 | Zhou ............... H01L 51/56 |
| 2020/0168831 | A1* | 5/2020 | Chen ............... H01L 51/0059 |

FOREIGN PATENT DOCUMENTS

| | | | |
|---|---|---|---|
| CN | 105679945 | A | 6/2016 |
| CN | 106449720 | A | 2/2017 |
| CN | 106549109 | A | 3/2017 |
| CN | 106549113 | A | 3/2017 |
| CN | 107644940 | A | 1/2018 |
| JP | 2007042875 | A | 2/2007 |
| JP | 2010272271 | A | 12/2010 |
| JP | 2014096572 | A | 5/2014 |
| JP | 2016500917 | A | 1/2016 |
| JP | 2016076571 | A | 5/2016 |
| KR | 1020130022985 | A | 3/2013 |
| KR | 1020140032628 | A | 3/2014 |
| KR | 1020160067545 | A | 6/2016 |
| TW | 200631456 | A | 9/2006 |
| TW | 201811753 | A | 4/2018 |
| WO | 2015186741 | A1 | 12/2015 |

OTHER PUBLICATIONS

CN First Office Action dated Apr. 10, 2019 in the corresponding CN application(application No. 201810713383.5).
CN Second Office Action dated Jul. 4, 2019 in the corresponding CN application (application No. 201810713383.5).
CN Third Office Action dated Sep. 9, 2019 in the corresponding CN application (application No. 201810713383.5).
Decision of Rejection issued by CN IP Office dated Nov. 26, 2019 in the corresponding CN application (application No. 201810713383.5).
TW First Office Action dated May 15, 2019 in the corresponding TW application (application No. 107133048).
TW Second Office Action dated Sep. 11, 2019 in the corresponding TW application (application No. 107133048).
First Office Action of Korean Application No. 10-2020-7008625.
First Office Action of Japanese Application No. 2020-515748.

* cited by examiner

ORGANIC ELECTROLUMINESCENT DEVICE AND AN ORGANIC ELECTROLUMINESCENT APPARATUS

CROSS-REFERENCES TO RELATED APPLICATIONS

The present application is a continuation application to PCT Application No. PCT/CN2018/106346, filed Sep. 19, 2018, which claims priority to Chinese Patent Application No. 201810713383.5, filed Jun. 29, 2018. Both applications are incorporated by reference herein for all purposes.

TECHNICAL FIELD

The present application relates to the field of display technologies, and particularly relates to an organic electroluminescent device and an organic electroluminescent apparatus.

BACKGROUND

An Organic Electroluminescent Display, such as Organic Light Emitting Diode (OLED), is an active light-emitting display apparatus. Due to its simple manufacturing process, low cost, high contrast ratio, wide viewing angle and low power consumption, it is expected to become the next-generation mainstream panel display technology, and is one of the panel display technologies that have received the most attention at present.

SUMMARY

In view of the above, the present application aims to solve the technical problem that the OLED display is prone to color cast in the prior art.

In order to solve the above-mentioned technical problem, the present application adopts the following technical solutions.

The embodiments of the present application provide an organic electroluminescent device which comprises a first electrode layer, a first carrier functional layer, a light-emitting layer and a second electrode layer stacked in sequence, wherein a P-doped layer is arranged between the first carrier functional layer and the light-emitting layer.

Optionally, the light-emitting layer is a blue light emitting layer, and the first carrier functional layer is disposed close to the blue light emitting layer and doped with a material in the blue light emitting layer.

Optionally, the P-doped layer comprises a first matrix material and a first doping material, and the first matrix material is identical to a material of the first carrier functional layer.

Optionally, the first doping material is a P-dopant.

Optionally, the P-dopant in the P-doped layer has a doping concentration of 0.1 wt % to 10 wt %.

Optionally, the P-dopant in the P-doped layer has a doping concentration of 1 wt % to 5 wt %.

Optionally, the P-doped layer has a thickness of 1 nm to 10 nm.

Optionally, the first carrier functional layer is an electron blocking layer or a hole transport layer or a hole injection layer.

Optionally, a second carrier functional layer is disposed between the light-emitting layer and the second electrode layer, and an N-doped layer is arranged between the second carrier functional layer and the light emitting layer.

Optionally, the N-doped layer comprises a second matrix material and a second doping material, the second matrix material is identical to a material of the second carrier functional layer.

Optionally, the second doping material is an N-dopant.

Optionally, the second carrier functional layer is a hole blocking layer or an electron transport layer or an electron injection layer.

Optionally, the P-doped layer is formed by evaporation-coating the first doping material together with the first matrix material, or by premixing the first doping material with the first matrix material and then performing an inkjet printing process.

The embodiments of the present application also provide an organic electroluminescent apparatus which comprises a plurality of pixel units arranged in an array, wherein each of the pixel units comprises a red light sub-pixel unit, a green light sub-pixel unit and a blue light sub-pixel unit, and each of the sub-pixel units comprises a first electrode layer, a light-emitting layer and a second electrode layer stacked in sequence, and the light-emitting layers in the red light sub-pixel unit, the green light sub-pixel unit and the blue light sub-pixel unit are respectively a red light emitting layer, a green light emitting layer and a blue light emitting layer; wherein the blue light sub-pixel unit comprises a first electrode layer, a first carrier functional layer, a blue light emitting layer, and a second electrode layer stacked in sequence, and a P-doped layer is arranged between the first carrier functional layer and the blue light emitting layer of the blue light sub-pixel unit.

Optionally, a turn-on voltage difference between the blue light sub-pixel unit and the red light sub-pixel unit is not more than 0.2V, and a turn-on voltage difference between the blue light sub-pixel unit and the green light sub-pixel unit is not more than 0.2V.

In the prior art, the process of turning on the organic electroluminescent device is to apply a certain driving voltage across the first electrode layer and the second electrode layer, so that carriers are transported over potential barriers into the light-emitting layer, thereby finally achieving recombination luminescence in the light-emitting layer. Therefore, the potential barriers between the light-emitting layer and the first electrode layer and between the light-emitting layer and the second electrode layer are an important factor in determining the driving voltage. That is, the driving voltage required to be applied across the first electrode layer and the second electrode layer increases as the potential barriers increase, and decreases as the potential barriers decrease.

The technical solutions of the present application have the following advantages:

The organic electroluminescent device provided by the embodiments of the present application comprises a first electrode layer, a first carrier functional layer, a light-emitting layer and a second electrode layer stacked in sequence, wherein a P-doped layer is arranged between the first carrier functional layer and the light-emitting layer. The arrangement of the first carrier functional layer helps to increase the migration rate of the carriers provided by the first electrode layer into the light-emitting layer, and a higher migration rate of the carriers can effectively reduce the turn-on voltage of the device and increase the light-emitting efficiency of the device. In the embodiments of the present application, a P-doped layer is arranged between the first carrier functional layer and the light-emitting layer, as a result, the energy level bending of an interface between the first carrier functional layer and the light-emitting layer is modified, and the hole injection potential barrier at the interface between the two is reduced, thereby effectively reducing the turn-on voltage of the organic electroluminescent device.

When the organic electroluminescent device is specifically applied, the turn-on voltage difference between this organic electroluminescent device and another adjacent organic electroluminescent device can be reduced, therefore, when this organic electroluminescent device having a particular luminescent color is turned on alone, even if the generated carriers migrate to another organic electroluminescent device having another luminescent color via the common carrier functional layer, the another organic electroluminescent device would not be turned on, so that the problem of color cast is solved and the display quality is improved.

In the organic electroluminescent device provided by the embodiments of the present application, the P-doped layer comprises a first matrix material and a first doping material, and the first matrix material is identical to a material of the first carrier functional layer, and the first doping material is a P-dopant. Using a material that is identical to the material of the first carrier functional layer to serve as the first matrix material helps to improve the energy level match degree between the first carrier functional layer and the P-doped layer, reduce the energy level difference between the first carrier functional layer and the P-doped layer, and lower the injection potential barrier at the interface between the first carrier functional layer and the P-doped layer.

In the organic electroluminescent device provided by the embodiments of the present application, the first carrier functional layer is an electron blocking layer or a hole transport layer or a hole injection layer, i.e., a P-doped layer may be arranged between an electron blocking layer and a light-emitting layer, or between a hole transport layer and a light-emitting layer, or between a hole injection layer and a light-emitting layer, there are multiple choices with strong flexibility, and the purpose of the present application can be equally achieved no matter which choice thereof is selected.

In the organic electroluminescent device provided by the embodiments of the present application, a second carrier functional layer is disposed between the light-emitting layer and the second electrode layer, and an N-doped layer is arranged between the second carrier functional layer and the light emitting layer. The arrangement of the second carrier functional layer helps to increase the migration rate of the carriers provided by the second electrode layer into the light-emitting layer, which further reduces the turn-on voltage of the device, so that the light-emitting efficiency of the device is improved. In the embodiments of the present application, a N-doped layer is further arranged between the second carrier functional layer and the light-emitting layer, as a result, the energy level bending of an interface between the second carrier functional layer and the light-emitting layer is modified, and the electron injection potential barrier at the interface between the two is reduced, thereby further reducing the turn-on voltage of the organic electroluminescent device.

In the organic electroluminescent apparatus provided by the embodiments of the present application, each of the pixel units comprises a red light sub-pixel unit, a green light sub-pixel unit and a blue light sub-pixel unit, and each of the sub-pixel units comprises a first electrode layer, a light-emitting layer and a second electrode layer stacked in sequence. Wherein, the blue light sub-pixel unit comprises a first electrode layer, a first carrier functional layer, a blue light emitting layer, and a second electrode layer stacked in sequence, and a P-doped layer is arranged between the first carrier functional layer and the blue light emitting layer of the blue light sub-pixel unit.

In the prior art, generally, the blue light sub-pixel unit has a larger turn-on voltage than those of the red light sub-pixel unit and the green light sub-pixel unit, and when the blue light sub-pixel unit is turned on alone, although the driving voltage is mainly applied across the blue light sub-pixel, the carriers generated will be applied to the green light sub-pixel and/or the red light sub-pixel via a common carrier functional layer, and because the green light sub-pixel and/or the red light sub-pixel has a smaller turn-on voltage and is thus likely to be turned on, a problem of color cast would be caused thereby.

By contrast, in the above technical solutions of the present application, a P-doped layer is arranged between the first carrier functional layer and the light-emitting layer in the blue light sub-pixel unit, which helps to modify the energy level bending of the interface between the first carrier functional layer and the light-emitting layer and reduce the hole injection potential barrier at the interface between the two, thereby effectively reducing the turn-on voltage of the blue light sub-pixel unit. Further, the turn-on voltage differences between the blue light sub-pixel unit and the red light sub-pixel unit and between the blue light sub-pixel unit and the green light sub-pixel unit are both reduced, therefore, when the blue light sub-pixel unit is turned on alone, even if some of the carriers migrate into the red light sub-pixel and the green light sub-pixel via a common carrier functional layer, it is not enough to turn on the red light sub-pixel unit and the green light sub-pixel unit, so that the problem of color cast is solved and the display quality is improved.

BRIEF DESCRIPTION OF THE DRAWINGS

In order to more clearly describe the technical solutions in the specific embodiments of the present application or in the prior art, hereinafter, the appended drawings used for describing the specific embodiments or the prior art will be briefly introduced. Apparently, the appended drawings described below are only directed to some embodiments of the present application, and for a person skilled in the art, without expenditure of creative labor, other drawings can be derived on the basis of these appended drawings.

The reference numerals are as follows:
1-first electrode layer; 2-first carrier functional layer; 3-P-doped layer; 31-first matrix material; 32-first doping material; 4-light-emitting layer; 5-N-doped layer; 51-second matrix material; 52-second doping material; 6-second carrier functional layer; 7-second electrode layer; 8-red light sub-pixel unit; 9-green light sub-pixel unit; 10-blue light sub-pixel unit.

DETAILED DESCRIPTION OF THE INVENTION

Figure 1:
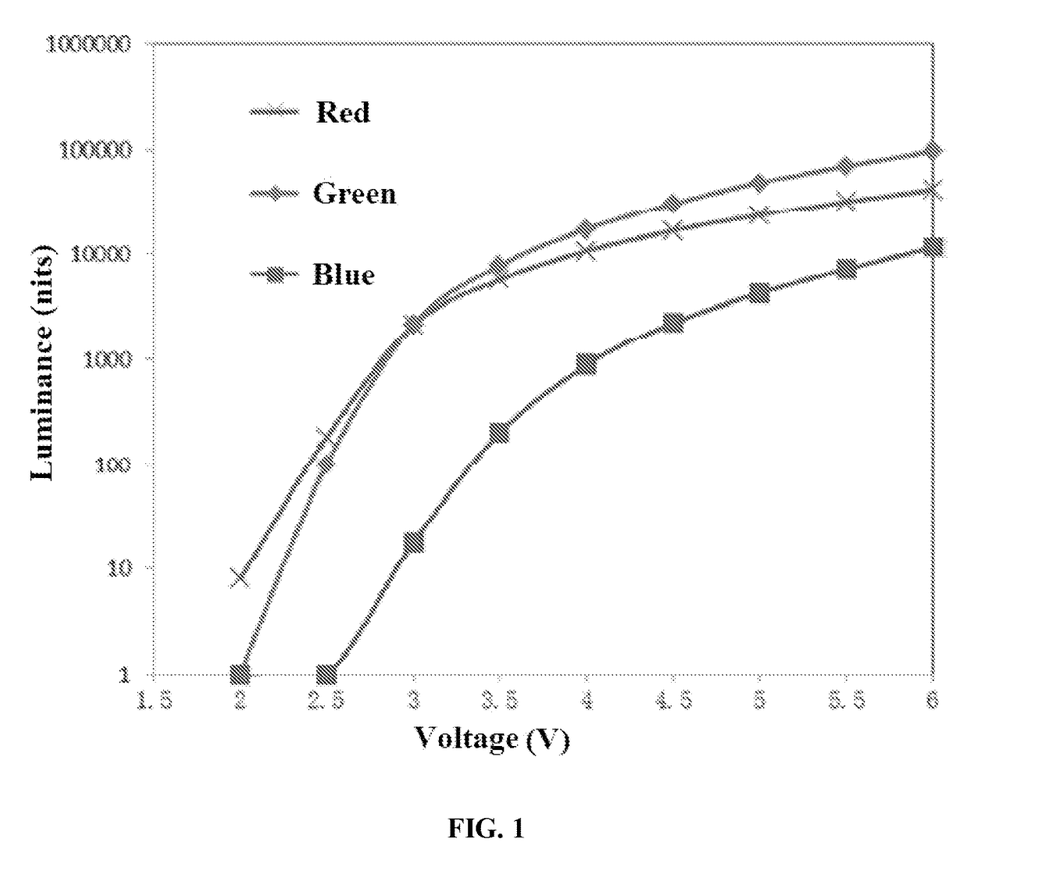
FIG. 1 shows a voltage-luminance curve diagram of RGB three-color sub-pixels in a full-color display device with a pixel juxtaposition mode.

FIG. 1 shows a luminance-voltage curve diagram of RGB three-color sub-pixels in a conventional display device. As can be seen from the diagram, in the conventional OLED display device, the turn-on voltages of the RGB three-color sub-pixels are inconsistent. Specifically, the blue light sub-pixel has a larger turn-on voltage than that of the green light sub-pixel, and the green light sub-pixel has a larger turn-on voltage than that of the red light sub-pixel. In practical applications, when the blue light sub-pixel is turned on, although the voltage is mainly applied across the blue light sub-pixel, some of the carriers generated in the blue light sub-pixel will migrate to the green light sub-pixel and/or the red light sub-pixel via a common hole injection layer since the common hole injection layer has relatively good electrical conductivity, and because both the red light sub-pixel and the green light sub-pixel have smaller turn-on voltages, the red light sub-pixel and/or the green light sub-pixel are likely to be turned on at the same time. That is, in the case of low gray scale, the light-emitting luminance of the red light sub-pixel and/or the green light sub-pixel cannot achieve the low luminance display effect in strict accordance with the requirements, and a phenomenon of low gray scale (reddish) color cast occurs.

A clear and complete description of the technical solutions of the present application will be described below with reference to the appended drawings. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In the description of the present application, it should be noted that, terms such as "center", "above", "below", "left", "right", "vertical", "horizontal", "inside", "outside" refer to the orientation or positional relationship based on the illustration of the appended drawings, and are only for the purpose of facilitating and simplifying the description of the present application, rather than indicating or implying that the apparatus or component referred to must have a particular orientation or must be configured or operated in a particular orientation, therefore should not be construed as a limitation towards the present application. In addition, terms such as "first", "second", "third" are merely for the purpose of description and should not be construed as an indication or implication of relative importance thereof.

In the description of the present application, it should be noted that, unless specifically defined or restricted otherwise, terms such as "mount", "interconnect", "connect" should be broadly construed, for example, it may be a fixed connection, a detachable connection or an integral connection; it may be a mechanical connection or an electrical connection; it may be either a direct connection or an indirect connection through an intermediate medium, or it may be an internal communication between two units; it may be a wireless connection or a wired connection. For a person skilled in the art, the specific meaning of the above terms in the present application may be understood according to specific situations thereof.

In addition, the technical features involved in different embodiments of the present application described below may be combined with one another as long as they do not conflict with one another.

Embodiment 1

Figure 2:
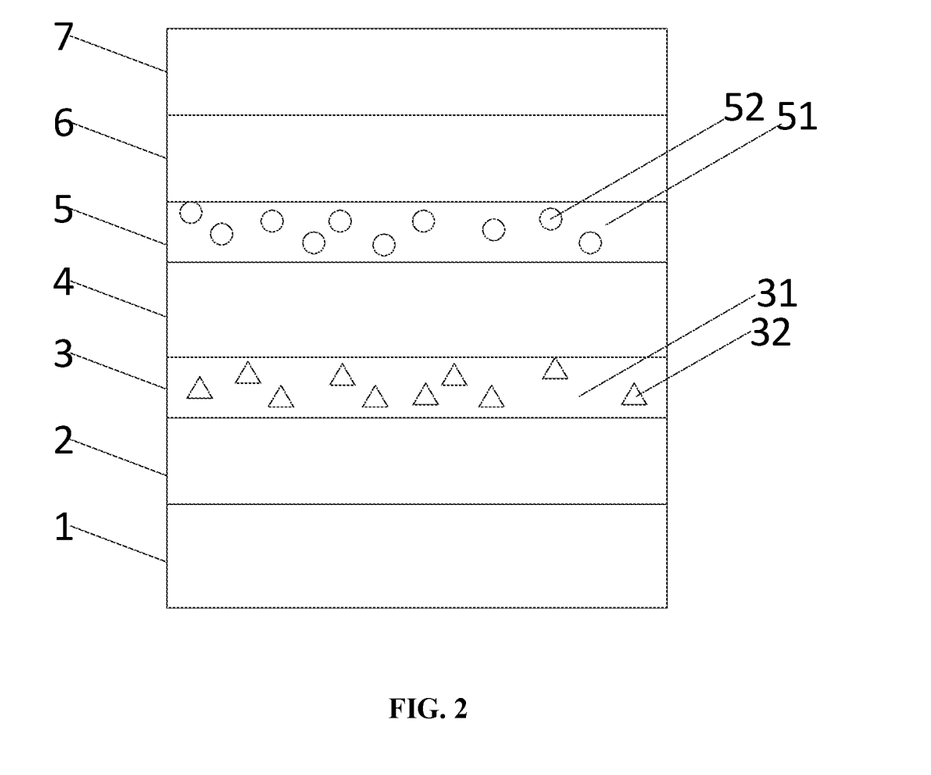
FIG. 2 shows a structural schematic diagram of an organic electroluminescent device of an embodiment of the present application.

This embodiment of the present application provides an organic electroluminescent device, as shown in FIG. 2, the organic electroluminescent device comprises a first electrode layer 1, a first carrier functional layer 2, a light-emitting layer 4 and a second electrode layer 7 stacked in sequence, the first electrode layer 1 is an anode and the second electrode layer 7 is a cathode, or the first electrode layer 1 is a cathode and the second electrode layer 7 is an anode. Hereinafter, the description will be made by taking the first electrode layer 1 as an anode and the second electrode layer 7 as a cathode.

In the prior art, the process of turning on the organic electroluminescent device is to apply a certain driving voltage across the first electrode layer 1 and the second electrode layer 7, so that carriers are transported over potential barriers into the light-emitting layer 4, thereby finally achieving recombination luminescence in the light-emitting layer 4. Therefore, the potential barriers between the light-emitting layer 4 and the first electrode layer 1 and between the light-emitting layer 4 and the second electrode layer 7 are an important factor in determining the driving voltage. That is, the driving voltage required to be applied across the first electrode layer 1 and the second electrode layer 7 increases as the potential barriers increase; and the driving voltage required to be applied across the first electrode layer 1 and the second electrode layer 7 decreases as the potential barriers decrease.

In the present embodiment, the arrangement of the first carrier functional layer 2 helps to increase the migration rate of the carriers provided by the first electrode layer 1 into the light-emitting layer 4, and a higher migration rate of the carriers can effectively reduce the turn-on voltage of the device and increase the light-emitting efficiency of the device. Wherein, as the first electrode layer 1 is an anode, the first carrier functional layer 2 increases the migration rate of holes.

Furthermore, in the present embodiment, a P-doped layer 3 is arranged between the first carrier functional layer 2 and the light-emitting layer 4, as a result, the energy level bending of an interface between the first carrier functional layer 2 and the light-emitting layer 4 is modified, and the hole injection potential barrier at the interface between the two is reduced, thereby effectively reducing the turn-on voltage of the organic electroluminescent device.

When the organic electroluminescent device is specifically applied, the turn-on voltage difference between this organic electroluminescent device and another adjacent organic electroluminescent device can be reduced, therefore, when this organic electroluminescent device having a particular luminescent color is turned on alone, even if the generated carriers migrate to another organic electroluminescent device having another luminescent color via the common carrier functional layer, the another organic electroluminescent device would not be turned on, so that the problem of color cast is solved and the display quality is improved.

Preferably, the light-emitting layer 4 in the above organic electroluminescent device is a blue light emitting layer.

Generally, a blue light organic electroluminescent device has a larger turn-on voltage than those of a red light organic electroluminescent device and a green light organic electroluminescent device. When the blue light organic electroluminescent device is turned on alone, although the driving voltage is mainly applied across the blue light organic electroluminescent device, some of the carriers will migrate into the adjacent green light and/or red light organic electroluminescent device via a common carrier functional layer, and because the green light and/or red light organic electroluminescent device has a lower turn-on voltage, the migrated carriers are enough to turn on the green light and/or red light organic electroluminescent device so a problem of color cast would be caused thereby.

In the present embodiment, the light-emitting layer 4 is provided as a blue light emitting layer, that is, the device belongs to a blue light organic electroluminescent device. That is, the carrier functional layer close to the blue light emitting layer is doped with a material in the blue light emitting layer, which improves the match degree between the energy level of the blue light emitting layer and the energy level of the carrier functional layer close thereto, reduces the energy level difference between the two, and reduces the injection potential barrier for carriers, thereby effectively reducing the turn-on voltage of the blue light organic electroluminescent device.

In practical application, the turn-on voltage differences between the blue light organic electroluminescent device and the red light organic electroluminescent device and between the blue light organic electroluminescent device and the green light organic electroluminescent device are reduced, therefore, when the blue light organic electroluminescent device is turned on alone, even if some of the carriers migrate into the red light organic electroluminescent device and the green light organic electroluminescent device via a common carrier functional layer, it is not enough to turn on the red light organic electroluminescent device and the green light organic electroluminescent device, so that the problem of color cast is solved and the display quality is improved.

As an optional implementation way, in the present embodiment, the P-doped layer 3 comprises a first matrix material 31 and a first doping material 32, and the first matrix material 31 is identical to a material of the first carrier functional layer 2, wherein the first doping material 32 is a P-dopant. Using a material that is identical to the material of the first carrier functional layer 2 to serve as the first matrix material 31 helps to improve the energy level match degree between the first carrier functional layer 2 and the P-doped layer 3, reduce the energy level difference between the first carrier functional layer 2 and the P-doped layer 3, and lower the injection potential barrier at the interface between the first carrier functional layer 2 and the P-doped layer 3.

It should be noted that, in the preparation process, the P-doped layer is formed by evaporation-coating the first doping material together with the first matrix material through co-evaporation; or the P-doped layer is formed by premixing the first doping material with the first matrix material and then performing an inkjet printing process.

In the present embodiment, the P-dopant may be at least one selected from NDP-9, TCNQ, F4-TCNQ, PPDN, etc.

As an optional implementation way, in the present embodiment, the P-dopant in the P-doped layer 3 has a doping concentration of 0.1 wt % to 10 wt %, more preferably 1 wt % to 5 wt %. That is, the potential barrier at the interface between the first carrier functional layer 2 and the light-emitting layer 4 can be controlled by adjusting the doping ratio of the P-dopant in the P-doped layer 3, thereby adjusting the turn-on voltage of the organic electroluminescent device.

As an optional implementation way, in the present embodiment, the P-doped layer has a thickness of 0.5 nm to 10 nm.

As an optional implementation way, in the present embodiment, the first carrier functional layer 2 is an electron blocking layer or a hole transport layer or a hole injection layer. That is, a P-doped layer 3 may be arranged between the electron blocking layer and the light-emitting layer 4, or between the hole transport layer and the light-emitting layer 4, or between the hole injection layer and the light-emitting layer 4, there are multiple choices with strong flexibility, and the purpose of the present application can be equally achieved no matter which choice thereof is selected. In the present embodiment, the first carrier functional layer 2 is preferably an electron blocking layer.

As an optional implementation way, in the present embodiment, a second carrier functional layer 6 is disposed between the light-emitting layer 4 and the second electrode layer 7, and an N-doped layer 5 is arranged between the second carrier functional layer 6 and the light emitting layer 4.

The arrangement of the second carrier functional layer 6 helps to increase the migration rate of the carriers provided by the second electrode layer 7 into the light-emitting layer 4, which further reduces the turn-on voltage of the device, so that the light-emitting efficiency of the device is improved. In this embodiment of the present application, a N-doped layer 5 is further arranged between the second carrier functional layer 6 and the light-emitting layer 4, as a result, the energy level bending of an interface between the second carrier functional layer 6 and the light-emitting layer 4 is modified, and the electron injection potential barrier at the interface between the two is reduced, thereby further reducing the turn-on voltage of the organic electroluminescent device.

As an optional implementation way, in the present embodiment, the N-doped layer 5 comprises a second matrix material 51 and a second doping material 52, the second matrix material 51 is identical to a material of the second carrier functional layer 6, and the second doping material 52 is an N-dopant. Using a material that is identical to the material of the second carrier functional layer 6 to serve as the second matrix material 51 helps to improve the energy level match degree between the second carrier functional layer 6 and the N-doped layer 5, reduce the energy level difference between the second carrier functional layer 6 and the N-doped layer 5, and lower the injection potential barrier at the interface between the second carrier functional layer 6 and the N-doped layer 5.

It should be noted that, in the preparation process, the N-doped layer is formed by evaporation-coating the second doping material together with the second matrix material through co-evaporation; or the N-doped layer is formed by premixing the second doping material with the second matrix material and then performing an inkjet printing process.

In the present embodiment, the N-dopant may be at least one selected from NTCDA, PTCDA, LiF, Li, Cs, $Cs_2CO_3$, $Li_2CO_3$, etc.

Embodiment 2

Figure 3:
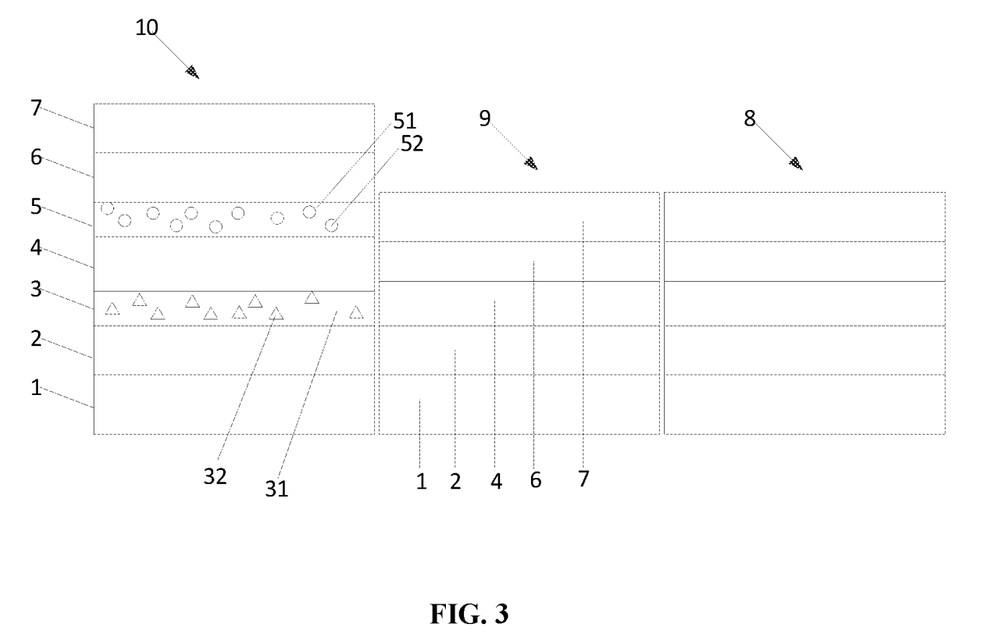
FIG. 3 shows a structural schematic diagram of an organic electroluminescent apparatus of an embodiment of the present application.

This embodiment of the present application provides an organic electroluminescent apparatus which comprises a plurality of pixel units arranged in an array, as shown in FIG. 3, each of the pixel units comprises a red light sub-pixel unit 8, a green light sub-pixel unit 9 and a blue light sub-pixel unit 10, and each of the sub-pixel units comprises a first electrode layer 1, a light-emitting layer 4 and a second electrode layer 7 stacked in sequence, and the light-emitting layers in the red light sub-pixel unit 8, the green light sub-pixel unit 9 and the blue light sub-pixel unit 10 are respectively a red light emitting layer, a green light emitting layer and a blue light emitting layer;

wherein the blue light sub-pixel unit 10 comprises a first electrode layer 1, a first carrier functional layer 2, a blue light emitting layer, and a second electrode layer 7 stacked in sequence, and a P-doped layer 3 is arranged between the first carrier functional layer 2 and the blue light emitting layer of the blue light sub-pixel unit 10.

Generally, the blue light sub-pixel unit 10 has a larger turn-on voltage than those of the red light sub-pixel unit 8 and the green light sub-pixel unit 9, and when the blue light sub-pixel unit 10 is turned on alone, although the driving voltage is mainly applied across the blue light sub-pixel 10, the carriers generated will be applied to the green light sub-pixel and/or red light sub-pixel 8 via a common carrier functional layer, and because the green light sub-pixel and/or the red light sub-pixel 8 has a smaller turn-on voltage and is thus likely to be turned on, a problem of color cast would be caused thereby.

A P-doped layer 3 is arranged between the first carrier functional layer 2 and the light-emitting layer 4 in the blue sub-pixel unit 10, which helps to modify the energy level bending of the interface between the first carrier functional layer 2 and the light-emitting layer 4 and reduce the hole injection potential barrier at the interface between the two, thereby effectively reducing the turn-on voltage of the blue sub-pixel unit 10. Further, the turn-on voltage differences between the blue sub-pixel unit 10 and the red sub-pixel unit 8 and between the blue sub-pixel unit 10 and the green sub-pixel unit 9 are both reduced, therefore, when the blue sub-pixel unit 10 is turned on alone, even if some of the carriers migrate into the red light sub-pixel and the green light sub-pixel via a common carrier functional layer, it is not enough to turn on the red sub-pixel unit 8 and the green sub-pixel unit 9, so that the problem of color cast is solved and the display quality is improved.

As an optional implementation way, in the present embodiment, a turn-on voltage difference between the blue light sub-pixel unit 10 and the red light sub-pixel unit 8, as well as a turn-on voltage difference between the blue light sub-pixel unit 10 and the green light sub-pixel unit 9, is not more than 0.2V. Therefore, as long as the turn-on voltage differences among the sub-pixel units having the three kinds of luminescent colors are sufficiently small, it can ensure that, when the blue light sub-pixel unit 10 is turned on, the red light sub-pixel unit 8 and the green light sub-pixel unit 9 cannot be turned on thereby, so that the problem of color cast is solved and the display quality is improved.

Embodiment 3

This embodiment of the present application provides a specific organic electroluminescent apparatus which comprises a plurality of pixel units arranged in an array, each of the pixel units comprises a red light sub-pixel unit 8, a green light sub-pixel unit 9 and a blue light sub-pixel unit 10.

Each of the sub-pixel units comprises a first electrode layer 1 (anode), a first carrier functional layer 2 (electron blocking layer), a light-emitting layer 4, a second carrier functional layer 6 (hole blocking layer), and a second electrode layer 7 (cathode) stacked in sequence, and the light-emitting layers 4 in the red light sub-pixel unit 8, the green light sub-pixel unit 9 and the blue light sub-pixel unit 10 are respectively a red light emitting layer, a green light emitting layer and a blue light emitting layer.

Wherein, a P-doped layer 3 is arranged between the electron blocking layer and the blue light emitting layer of the blue light sub-pixel unit 10. The P-doped layer 3 comprises a first matrix material which is TPD and a P-dopant which is NDP-9, the P-dopant in the P-doped layer 3 has a doping concentration of 5 wt %, and the P-doped layer has a thickness of 6 nm.

The blue sub-pixel unit 10 has a device structure as follows:
ITO (100 nm)/TPD (5 nm)/TPD: NDP-9 (5%, 6 nm)/CBP: BCzVBI (3%, 30 nm)/NPB (5 nm)/Mg: Ag (20%, 15 nm).

Embodiment 4

This embodiment of the present application provides a specific organic electroluminescent apparatus, which is basically the same as the organic electroluminescent device described in Embodiment 3, the only difference is:

The P-dopant in the P-doped layer 3 has a doping concentration of 1 wt %.

Embodiment 5

This embodiment of the present application provides a specific organic electroluminescent apparatus, which is basically the same as the organic electroluminescent device described in Embodiment 3, the only difference is:

The P-dopant in the P-doped layer 3 has a doping concentration of 10 wt %.

Embodiment 6

This embodiment of the present application provides a specific organic electroluminescent apparatus, which is basically the same as the organic electroluminescent device described in Embodiment 3, the only difference is:

The P-doped layer 3 has a thickness of 1 nm.

Embodiment 7

This embodiment of the present application provides a specific organic electroluminescent apparatus, which is basically the same as the organic electroluminescent device described in Embodiment 3, the only difference is:

The P-doped layer 3 has a thickness of 10 nm.

Comparison Example 1

This comparison example of the present application provides a specific organic electroluminescent apparatus, which is basically the same as the organic electroluminescent device described in Embodiment 3, the only difference is:

The first matrix material 31 in the P-doped layer 3 is NPB.

Comparison Example 2

This comparison example of the present application provides a specific organic electroluminescent apparatus, which is basically the same as the organic electroluminescent device described in Embodiment 3, the only difference is:

The P-dopant in the P-doped layer 3 has a doping concentration of 15 wt %.

Comparison Example 3

This comparison example of the present application provides a specific organic electroluminescent apparatus, which is basically the same as the organic electroluminescent device described in Embodiment 3, the only difference is:

The P-doped layer has a thickness of 20 nm.

Comparison Example 4

This comparison example of the present application provides a specific organic electroluminescent apparatus, which is basically the same as the organic electroluminescent device described in Embodiment 3, the only difference is:

There is no P-doped layer 3 provided between the electron blocking layer and the light-emitting layer 4 of the blue light sub-pixel unit 10. In the present embodiment, the blue light sub-pixel unit 10 has a device structure as follows:
ITO (100 nm)/TPD (5 nm)/CBP: BCzVBI (3%, 30 nm)/NPB (5 nm)/Mg: Ag (20%, 15 nm).

The above Embodiments 3-7 and Comparative examples 1-4 were tested, and the test results were compared and listed in the following table:

|  | Red light unit Turn-on voltage (V) | Green light unit | Blue light unit | | |
| --- | --- | --- | --- | --- | --- |
|  |  |  | Luminance (cd/m$^2$) | Turn-on voltage (V) | chromatic coordinates (CIE x, y) |
| Embodiment 3 | 2.4 | 2.61 | 1 | 2.56 | 0.140, 0.050 |
| Embodiment 4 | 2.4 | 2.61 | 1 | 2.60 | 0.141, 0.048 |
| Embodiment 5 | 2.4 | 2.61 | 1 | 2.58 | 0.140, 0.049 |
| Embodiment 6 | 2.4 | 2.61 | 1 | 2.59 | 0.140, 0.050 |
| Embodiment 7 | 2.4 | 2.61 | 1 | 2.58 | 0.140, 0.049 |
| Comparison example 1 | 2.4 | 2.61 | 1 | 2.80 | 0.140, 0.050 |
| Comparison example 2 | 2.4 | 2.61 | 1 | 2.65 | 0.142, 0.047 |
| Comparison example 3 | 2.4 | 2.61 | 1 | 2.70 | 0.141, 0.048 |
| Comparison example 4 | 2.4 | 2.61 | 1 | 2.80 | 0.142, 0.047 |

It can be seen from the above test data that, with a P-doped layer being arranged between the first carrier functional layer and the light-emitting layer of the blue light sub-pixel unit in the organic electroluminescent device provided by the present application, it helps to modify the energy level bending of the interface between the first carrier functional layer and the light-emitting layer and reduce the hole injection potential barrier at the interface between the two, thereby effectively reducing the turn-on voltage of the blue light sub-pixel unit. Further, the turn-on voltage differences between the blue light sub-pixel unit and the red light sub-pixel unit and between the blue light sub-pixel unit and the green light sub-pixel unit are both reduced, therefore, when the blue light sub-pixel unit is turned on alone, even if some of the carriers migrate into the red light sub-pixel and the green light sub-pixel via a common carrier functional layer, it is not enough to turn on the red light sub-pixel unit and the green light sub-pixel unit, so that the problem of color cast is solved and the display quality is improved.

Apparently, the aforementioned embodiments are merely examples illustrated for clearly describing the present application, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present application.

The invention claimed is:

1. An organic electroluminescent device, comprising a first electrode layer, a first carrier functional layer, a light-emitting layer and a second electrode layer stacked in sequence, wherein the first carrier functional layer is an electron blocking layer, and a P-doped layer is arranged between the electron blocking layer and the light-emitting layer,
   wherein the light-emitting layer is a blue light emitting layer, the electron blocking layer is doped with a material in the blue light emitting layer, and the P-doped layer is in direct contact with the blue light emitting layer,
   wherein a second carrier functional layer is disposed between the light-emitting layer and the second electrode layer, the second carrier functional layer is a hole blocking layer, and an N-doped layer is arranged between the hole blocking layer and the light emitting layer, wherein the N-doped layer is in direct contact with the light emitting layer.

2. The organic electroluminescent device according to claim 1, wherein the P-doped layer comprises a first matrix material and a first doping material, and the first matrix material is identical to a material of the electron blocking layer.

3. The organic electroluminescent device according to claim 2, wherein the first doping material is a P-dopant, the P-dopant is at least one selected from NDP-9 and PPDN.

4. The organic electroluminescent device according to claim 3, wherein the P-dopant in the P-doped layer has a doping concentration of 0.1 wt % to 10 wt %.

5. The organic electroluminescent device according to claim 3, wherein the P-dopant in the P-doped layer has a doping concentration of 1 wt % to 5 wt %.

6. The organic electroluminescent device according to claim 1, wherein the P-doped layer has a thickness of 0.5 nm to 10 nm.

7. The organic electroluminescent device according to claim 1, wherein the N-doped layer comprises a second matrix material and a second doping material, the second matrix material is identical to a material of the hole blocking layer.

8. The organic electroluminescent device according to claim 7, wherein the second doping material is an N-dopant.

9. The organic electroluminescent device according to claim 2, wherein the P-doped layer is formed by evaporation-coating the first doping material together with the first matrix material, or by premixing the first doping material with the first matrix material and then performing an inkjet printing process.

10. An organic electroluminescent apparatus, comprising a plurality of pixel units arranged in an array, wherein each of the pixel units comprises a red light sub-pixel unit, a green light sub-pixel unit and a blue light sub-pixel unit, and each of the sub-pixel units comprises a first electrode layer, a light-emitting layer and a second electrode layer stacked in sequence, and the light-emitting layers in the red light sub-pixel unit, the green light sub-pixel unit and the blue light sub-pixel unit are respectively a red light emitting layer, a green light emitting layer and a blue light emitting layer;

wherein the blue light sub-pixel unit comprises a first electrode layer, a first carrier functional layer, a blue light emitting layer, and a second electrode layer stacked in sequence, the first carrier functional layer is an electron blocking layer, and a P-doped layer is arranged between the electron blocking layer and the blue light emitting layer of the blue light sub-pixel unit, wherein the electron blocking layer is doped with a material in the blue light emitting layer, and the P-doped layer is in direct contact with the blue light emitting layer, wherein a second carrier functional layer is disposed between the blue light-emitting layer and the second electrode layer, the second carrier functional layer is a hole blocking layer, and an N-doped layer is arranged between the hole blocking layer and the blue light emitting layer, wherein the N-doped layer is in direct contact with the blue light emitting layer.

11. The organic electroluminescent apparatus according to claim 10, wherein a turn-on voltage difference between the blue light sub-pixel unit and the red light sub-pixel unit is not more than 0.2V, and a turn-on voltage difference between the blue light sub-pixel unit and the green light sub-pixel unit is not more than 0.2V.

12. The organic electroluminescent apparatus according to claim 10, wherein the P-doped layer has a doping concentration of 0.1 wt % to 10 wt %.

13. The organic electroluminescent apparatus according to claim 10, wherein the P-doped layer has a doping concentration of 1 wt % to 5 wt %.

14. The organic electroluminescent apparatus according to claim 10, wherein the P-doped layer has a thickness of 0.5 nm to 10 nm.

15. The organic electroluminescent apparatus according to claim 10, wherein the N-doped layer comprises a second matrix material and a second doping material, the second matrix material is identical to a material of the hole blocking layer.

* * * * *